United States Patent
Satou et al.

[11] Patent Number: 5,961,850
[45] Date of Patent: Oct. 5, 1999

[54] PLASMA PROCESSING METHOD AND APPARATUS

[75] Inventors: Yoshiaki Satou, Tokuyama; Tadamitsu Kanekiyo; katsuyoshi Kudo, both of Kudamatsu, all of Japan

[73] Assignee: Hitachi, Ltd., Tokyo, Japan

[21] Appl. No.: 08/615,949

[22] Filed: Mar. 14, 1996

[30] Foreign Application Priority Data

Mar. 20, 1995 [JP] Japan ................................. 7-060383

[51] Int. Cl.⁶ .................................................. H05H 1/00
[52] U.S. Cl. ................................ 216/67; 216/68; 216/70; 216/71; 438/710; 438/728; 438/729; 427/569; 427/571; 427/575; 156/345; 118/723 R; 118/723 I; 118/723 MR; 118/724
[58] Field of Search ........................ 156/345; 118/723 E, 118/723 R, 723 MW, 723 ME, 723 MR, 723 MA, 723 I, 724; 438/729, 730, 732, 727, 728, 710; 216/67, 68, 69, 70, 71; 427/569, 571, 575

[56] References Cited

U.S. PATENT DOCUMENTS

| | | | |
|---|---|---|---|
| 5,102,496 | 4/1992 | Savas | 156/345 X |
| 5,254,171 | 10/1993 | Hayakawa et al. | 118/723 MR |
| 5,368,685 | 11/1994 | Kumihashi et al. | 156/345 X |
| 5,449,411 | 9/1995 | Fukuda et al. | 118/723 MR X |
| 5,531,862 | 7/1996 | Otsubo et al. | 156/345 X |
| 5,616,208 | 4/1997 | Lee | 156/345 |
| 5,647,945 | 7/1997 | Matsuse et al. | 156/345 |

*Primary Examiner*—Thi Dang
*Attorney, Agent, or Firm*—Antonelli, Terry, Stout & Kraus, LLP

[57] ABSTRACT

A plasma processing apparatus and method controls the temperature of those portions in the processing chamber to which reaction products or gaseous reaction products generated during plasma processing adhere, thereby minimizing the generation of foreign matter and ensuring high yields. A plasma processing gas is supplied to the plasma generation chamber 10 whose pressure is maintained at a predetermined value. Provided in the plasma generation chamber are a specimen mount 11 on which to mount an object to be processed and an evacuation mechanism 16 that evacuates the plasma generation chamber. The inner sidewall portion of the plasma generation chamber is provided with a temperature controller 34, which heats the inner side wall portion of the processing chamber above the specimen to a temperature at which reaction products sublimate, and a further temperature controller 35 is provided to cool the lower part of the specimen mount, the inner bottom portion of the processing chamber and the chamber exhaust pipe to a temperature at which the reaction products solidify.

15 Claims, 4 Drawing Sheets

PLASMA PROCESSING METHOD AND APPARATUS

BACKGROUND OF THE INVENTION

The present invention relates to a plasma processing method and apparatus and more specifically to a plasma processing method and apparatus suited for plasma-processing specimens such as semiconductor device substrates.

There has been available a technique of plasma-processing specimens of semiconductor device substrates, as represented by a technique described in Japanese Patent Laid-Open No. 167825/1991. This publication describes a technique which limits the temperature control of a processing chamber where plasma is generated only to a sidewall portion and deals with only reaction products that are generated after etching.

The above-mentioned technique is effective only for reaction products adhering to the inner surface of the sidewall of the processing chamber and does not consider reaction products or gaseous reaction products adhering the electrodes, i.e., the lower part of the specimen mount, the inner bottom portion of the processing chamber and the exhaust pipe, during the plasma processing.

That is, reaction products also adhere to the lower part of the specimen mount, the inner bottom portion of the processing chamber and the exhaust pipe. During the plasma processing, these reaction products are not only deposited on these portions, but also flake off, thereby contaminating the specimens and greatly reducing the yield of specimens.

SUMMARY OF THE INVENTION

The object of this invention is to provide a plasma processing method and apparatus, which controls the temperature of locations where reaction products or gaseous reaction products (hereinafter referred to as reaction products) adhere, thereby preventing abnormal generation of reaction products and ensuring high yield of specimens.

To achieve the above objective, the locations above the specimen are controlled to temperatures at which the reaction products do not solidify and the locations below the specimen (lower part of the specimen mount, inner bottom portion of the processing chamber, exhaust pipe, etc.) are controlled to temperatures at which the reaction products solidify.

With this invention, the portions, of the inner side surface of the processing chamber above the specimen where plasma is generated (plasma generation portion) are set at temperatures at which reaction products sublimate, while the lower part of the specimen mount, the inner bottom portion of the processing chamber and the exhaust pipe are set at temperatures at which the reaction products solidify. This prevents the reaction products from adhering to locations above the specimen and therefore prevents foreign matter from falling onto the surface of the specimen being processed. Reaction products and foreign matter floating in the processing chamber (hereinafter called floating foreign matters) adhere to or are trapped by the lower portion of the specimen mount, the inner bottom portion in the processing chamber and the exhaust pipe. While a vacuum is maintained, foreign matter can be prevented from being flaked off, and the flaked off foreign matter can be prevented from floating around because these locations are controlled at all times at temperatures at which reaction products solidify.

DETAILED DESCRIPTION OF PREFERRED EMBODIMENTS

Now, one embodiment of this invention will be described by referring to FIGS. 1–3 of the accompanying drawings.

Figure 1:
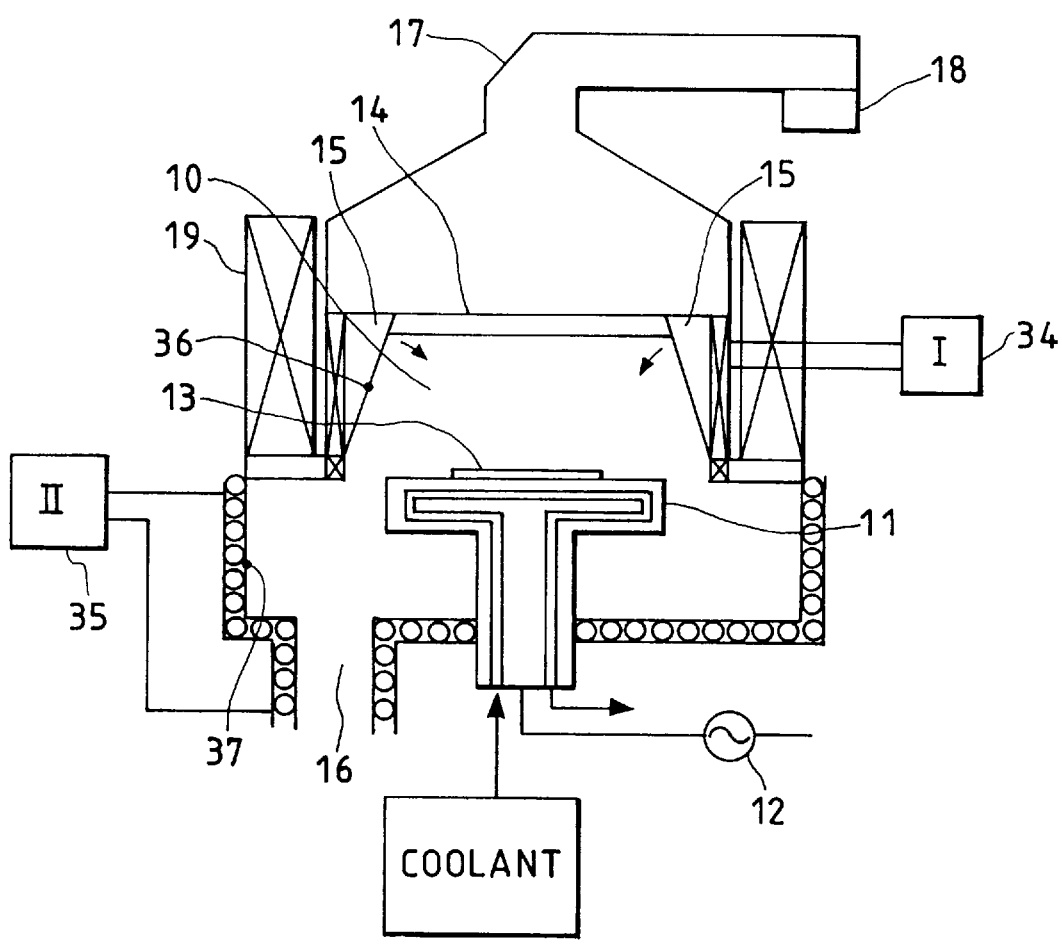
FIG. 1 is a vertical cross section showing a microwave plasma processing apparatus representing one embodiment of this invention.

FIG. 1 is a vertical cross section of an essential portion of a microwave plasma processing apparatus showing its outline configuration according to this invention.

In FIG. 1, a processing chamber 10 has a quartz discharge tube 14 as its upper constitutional element. The processing chamber 10 is provided with a gas supply port 15, connected to a gas source (not shown) for supplying an etching gas to the processing chamber 10, and also with an exhaust port 16 leading to a vacuum discharge apparatus (not shown). In the processing chamber 10 there is installed a specimen mount 11 on which to place a semiconductor device substrate (wafer) 13. The specimen mount 11 is connected to high frequency power source 12 so that a high frequency power can be applied to the specimen mount 11. The discharge tube 14 is enclosed by a waveguide 17, and on the outer side of which there is provided a solenoid coil 19 that produces a magnetic field in the discharge tube 14. The discharge tube 14 in the processing chamber 10 is provided with a temperature controller I34. The waveguide 17 is provided at its end with a magnetron 18 that generates microwaves. A lower part of the specimen mount, the inner bottom portion of the chamber and the exhaust pipe in the processing chamber 10 are also provided with a temperature controller II35.

The temperature controllers I34, II35, control the temperature of the inner sidewall of the processing chamber to a desired temperature according to temperature sensors 36, 37 fitted to the inner sidewall of the processing chamber or installed in the sidewall. It is also possible to set a plurality of locations for temperature control, i.e., for heating and cooling.

In the plasma processing apparatus having this construction, a processing gas for etching is supplied from the gas supply port 15 into the processing chamber 10 and at the same time the processing chamber 10 is evacuated to a specified pressure. Then, microwaves are introduced into the discharge tube 14 from the magnetron 18 through the waveguide 17, and the solenoid coil 19 generates a magnetic field to plasmatize the processing gas in the discharge tube 14 by the interaction between the electric field of the microwaves and the magnetic field of the solenoid coil 19. The high frequency power source 12 applies a high frequency power to the specimen mount 11 to produce a bias voltage and thereby draw ions in the plasma toward the wafer 13 to perform anisotropic etching on the wafer 13. At this time, the reaction products produced by etching are discharged from the sidewall and lower part of the specimen mount and from the inner bottom of the processing chamber through the exhaust pipe.

The temperature control regions for the temperature controllers I34, I135, are shown in Table 1. As shown in Table 1, the inner sidewall portion corresponding to the plasma generation region in the processing chamber 10 is controlled to an elevated temperature range of 100° C. and more than 10° C. to 400° C. while other portions, such as the side surface and lower part of the specimen mount, the inner bottom portion of the processing chamber and the exhaust pipe, are cooled at −200° C. or more than −200° C. to less than 100° C. The reason why the cooling temperature is set at more than −200° C. or −200° C. is based on the objective to cool the lower part of the chamber.

Liquid nitrogen is practically available and it can cool to about −200° C., so the cooling lowest limit will be decided.

TABLE 1

| No. | Heating | Cooling |
| --- | --- | --- |
| I | 100° C. to 400 ° C. | — |
| II | — | −200° C. to 100° C. |

Figure 2:
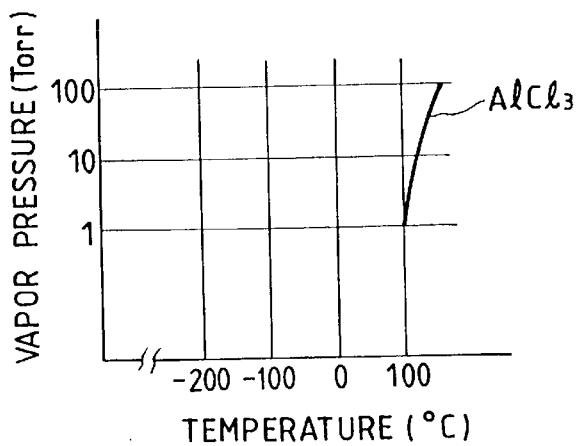
FIG. 2 is a vapor pressure curve diagram for etching gases and reaction products relative this invention.

The temperature control is explained by referring to FIG. 2. FIG. 2 shows an example of a vapor pressure curve for the etching gas and reaction products in the case of the use of aluminum wiring material.

In FIG. 2, when the aluminum wire is processed with gases $BCl_3$ and $Cl_2$, the reaction products are $AlCl_3$ and are evaporated and discharged.

The reaction product $AlCl_3$ solidifies at 100° C. when the etching pressure is 1 Torr. That is, it is seen that reaction products are deposited when the inner sidewall of the processing chamber of the plasma processing apparatus of FIG. 1 is lower than 100° C.

Hence, if the plasma processing is performed continuously under this condition, deposits flake off as foreign matters in the processing chamber. With this embodiment, however, by setting the inner sidewall of the processing chamber at 100° C. or more than 100° C and the lower part of the specimen mount, the inner bottom portion of the processing chamber and the exhaust pipe at lower than 100° C., it is possible to prevent the reaction products from adhering to the inner sidewall of the processing chamber and cause the reaction products to selectively adhere to the lower part of the specimen mount, the inner bottom of the processing chamber and the exhaust pipe, thereby minimizing the possibility of foreign matter falling onto the surface of the wafer being etched or floating from the inner bottom of the processing chamber.

For other wiring materials, a similar effect is also obtained by establishing appropriate temperature conditions in the processing chamber, at the sidewall and lower part of the specimen mount, the inner bottom portion of the processing chamber and the exhaust pipe.

Figure 3:
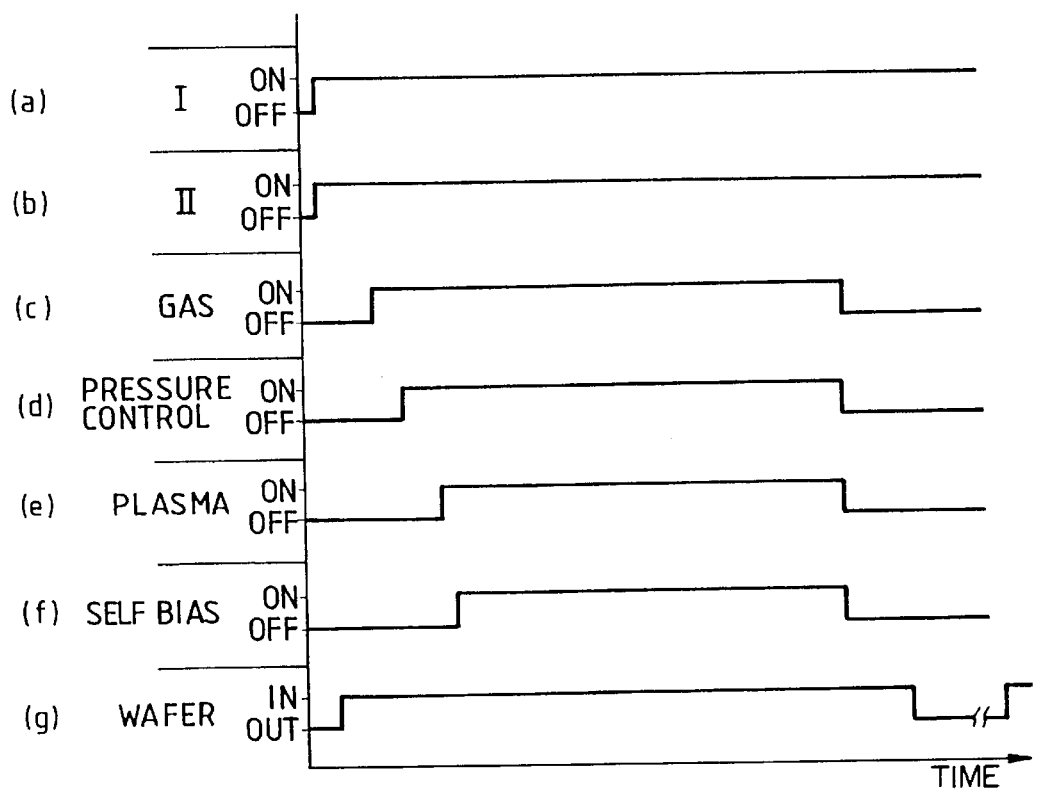
FIG. 3 is a control sequence diagram for the plasma processing apparatus of this invention.

FIG. 3 shows the control sequence for the plasma processing apparatus of FIG. 1.

In FIG. 3, before a wafer is introduced in the apparatus, the temperature controller I34 controls the temperature of the inner sidewall of the processing chamber and the temperature controller II35 controls the temperature of the side surface and lower part of the specimen mount, the inner bottom portion of the processing chamber and the exhaust pipe. After the wafer is introduced, the normal etching sequence is performed. After plasma processing is finished, the temperature controllers I34, II35 are turned off and the apparatus is opened to air for normal cleaning.

When the temperature controller I34 is started, the processing chamber 10 is heated to a predetermined temperature where it is to be maintained by temperature control. When the temperature controller II35 is started, the lower portion of the specimen mount 11, the inner bottom portion of the processing chamber 10 and the exhaust pipe are cooled to a predetermined temperature where they are to be maintained by temperature control.

Next, the wafer 13, in this case one wafer, is carried into the processing chamber 10 by a wafer carrying device, not shown. The wafer 13 is transferred from the wafer carrying device onto the surface of the specimen mount, with the surface of the wafer to be etched facing up. The wafer 13 thus mounted on the specimen mount 11 is held immovable.

After or before the above operation is completed, the processing chamber 10 is evacuated. By activating the evacuation device, the gases in the processing chamber 10 are discharged through the exhaust pipe fitted with an exhaust valve and a variable resistance valve (not shown). The pressure in the processing chamber 10 being evacuated is reduced to a specified pressure by adjusting the variable resistance valve.

Next, the etching gas is supplied from the gas supply source through the gas supply port 15 into the processing chamber 10. The amount of etching gas supplied to the processing chamber 10 is controlled to a predetermined value by a gas flow controller (not shown).

Then, a part of the etching gas supplied into the processing chamber 10 is discharged out of the processing chamber 10 by the evacuation device to control the pressure in processing chamber 10 at a specified etching processing pressure.

Next, the magnetron 18 and the solenoid coil 19 are operated to plasmatize the etching gas in the processing chamber 10. As a result, the etching surface of the wafer 13 held on the specimen mount 11 is processed by the plasma. At the same time, the high frequency power source 12 is operated to apply the high frequency power to the specimen mount 11, thereby applying a bias to the wafer 13. With the bias applied, the etching surface of the wafer 13 is etched.

When the etch processing of the wafer 13 is completed in this way, the supply of etching gas to the processing chamber 10 and the operation of the high frequency power source 12, magnetron 18 and solenoid coil 19 are stopped. At this time, the processed wafer 13 is transferred from the specimen mount 11 to the wafer carrying device, which takes it out of the processing chamber 10. Then, a new wafer 13 is placed into the processing chamber 10 by the wafer carrying device, and the above-mentioned processing is performed. The temperature controllers I34, II35 continue their operation to keep the temperatures of various portions of the apparatus at the controlled temperatures. In some cases, the operation of the temperature controllers I34, II35, may be stopped between the wafer processing. For example, the apparatus is stopped when the wafer processing is interrupted for an extended period of time because of failure or for some other reasons, or when the work for the day has been finished. The operation of the temperature controllers I34, I135 is also stopped when the interior of the processing chamber 10 is opened to air for cleaning. Particularly by stopping the operation of the temperature controller I135, it is possible to prevent impurities, such as water contained in air, from adhering to the cooled portions when the processing chamber 10 is opened to air. In this way, inconveniences that may be experienced at the time of evacuation of the processing chamber 10 (prolonged evacuation time and failure to reach a specified pressure) can be eliminated.

The control temperatures of various portions controlled by the temperature controllers I34, I135 depend on the film quality of the wafer 13, i.e., wiring material and the kind of etching gas.

Information concerning the wafer 13 to be etched, such as the wiring material and the kind of etching gas compatible with the wiring material, is entered into the higher level controller (not shown) by an operator. The higher level controller then outputs control signals to the temperature controllers I34, I135, which in turn control the temperatures of various portions.

Such a temperature control is performed by an operator entering the information concerning the wafer 13 through a touch panel or by reading the wafer information by some means into the higher level controller or directly into the temperature controllers I34, I135.

In this way, the temperatures of various portions can be controlled reliably to specified temperatures, thereby improving the wafer yield stably and reliably.

The maintenance of the portions cooled by the temperature controller I135 (cooled portions) is particular in performed as follows.

According to the present invention, reaction products are made to adhere to the cooled portions, forming deposits there. Thus, maintenance is performed before or when the deposit thickness reaches a point that causes an increase in exhaust resistance or produces foreign matter by deposit flaking. At this time, the cooling of the cooled portions by the temperature controller I135 is stopped. The cooled portions are then heated to the sublimation temperature of the deposit. As a result of heating, the deposit adhering to the cooled portion is sublimated and discharged out of the processing chamber 10 by operating the evacuation device. When the sublimation is finished, the heating of the cooled portions is stopped and temperature control by the temperature controller I135 is performed. The heating of the cooled portions may be realized by adding a heating device (not shown) or by constructing the temperature controller I135 to have cooling and heating functions and by switching between these functions.

Where the cleaning of the processing chamber 10 is done by opening the processing chamber 10 to air, the maintenance of the cooled portions is done before opening the processing chamber 10 to air. Where the cleaning of the processing chamber 10 is done by plasma without opening the processing chamber 10 to air, the maintenance is performed before or during cleaning. When the maintenance is performed during cleaning and when the adhering deposit can be removed from the cooled portions, there is no need to heat the cooled portions.

This embodiment offers the following advantages.

With the technique of heating the inner sidewall portion of the processing chamber, it is possible to prevent adhesion and deposition of reaction products produced by etching to the inner sidewall portion as mentioned above. Further, when this technique is employed also to heat the lower part of the specimen mount, the inner bottom portion of the processing chamber and the exhaust pipe, the adhesion and deposition of reaction products on these portions can also be prevented.

This technique, however, cannot remove foreign matter floating in the processing chamber and it is not possible to prevent reduction in wafer yield caused by floating foreign matter. This drawback becomes salient as the capacity of semiconductors increases to 65M and 256M. Further, because a major part of the reaction products is evacuated out of the processing chamber, the evacuation system including vacuum evacuation device, evacuation valve and variable resistance valve may be damaged. This problem becomes more serious when the reaction products are corrosive.

As an alternative, a technique may be adopted which cools the lower part of the specimen mount, the inner bottom portion of the processing chamber and the exhaust pipe to cause the reaction products to adhere to the cooled portions.

With this technique, however, because the cooling of the inner bottom portion of the processing chamber reduces the temperature of the inner sidewall portion of the processing chamber below the evaporation point of reaction products, the reaction products and floating foreign matter adhere to or become deposited on the inner sidewall portion of the processing chamber. Because the inner sidewall portion of the processing chamber is located higher than the etching surface of the water being processed, the adhesion and deposition of reaction products to the inner sidewall portion is very disadvantageous in terms of wafer yield. That is, the deposit may flake off the inner sidewall portion of the processing clamber and fall as foreign matter onto the wafer being processed, thereby lowering the yield.

To deal with these problems, the embodiment of this invention heats the inner sidewall portion of the processing chamber to a temperature at which reaction products will not adhere to it and, at the same time, cools the lower part of the specimen-mount, the inner bottom portion of the processing chamber and the exhaust pipe to a temperature at which the reaction products easily adhere to them. This prevents foreign matter from being formed, thus improving the wafer yield.

In other words, this embodiment is characterized by the concept that the adhesion of reaction products to the inner sidewall portion of the processing chamber located higher than the etching surface of the wafer being processed is minimized, while at the same time reaction products and floating foreign matter are positively induced to adhere to the lower part of the specimen mount, the inner bottom portion of the processing chamber and the exhaust pipe, all located below the etching surface of the wafer. This concept is very effective for preventing generation of foreign matter and for obtaining improvement of wafer yield.

Further, because the reaction products are positively induced to adhere to particular locations, such as the lower part of the specimen mount, the inner bottom portion of the processing chamber and the exhaust pipe, it is possible to remove deposits adhering to these portions periodically and easily by cleaning, replacement and baking, improving the maintainability of the processing apparatus.

Furthermore, because the reaction products and floating foreign matter are arrested to the extent that the evacuation system is not adversely affected, the conventional problem of the evacuation system being damaged by the reaction products and floating foreign matter is eliminated.

This invention can also be applied to the constructions shown in FIGS. 4 to 7 in addition to the above embodiment.

Figure 4:
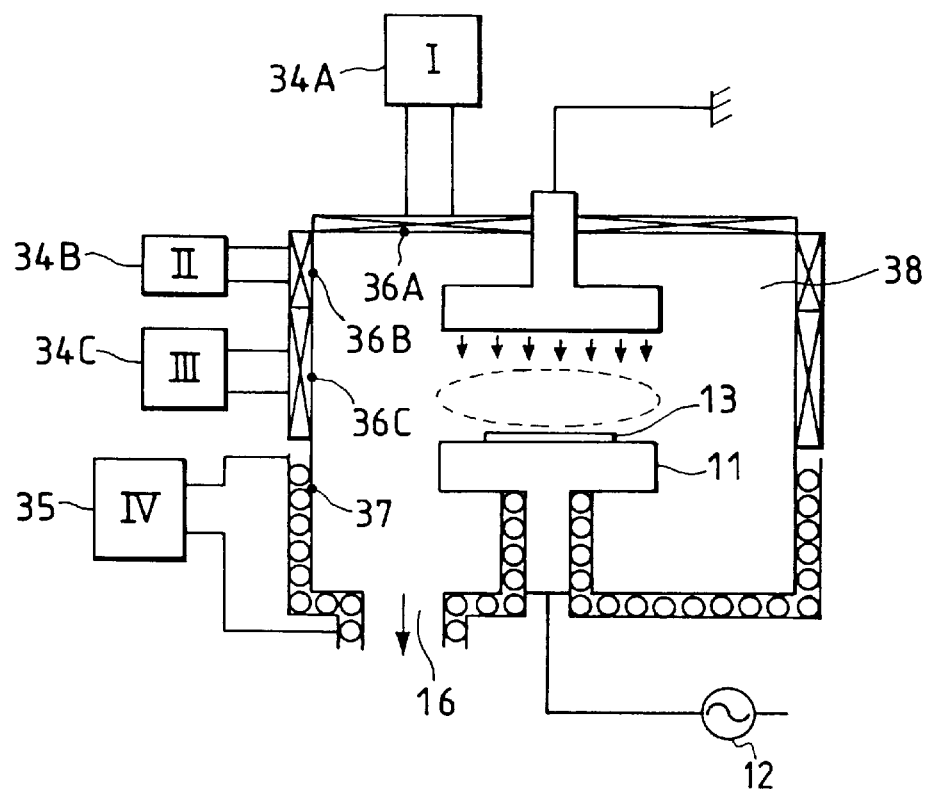
FIG. 4 is a vertical cross section showing a parallel plate type plasma etching apparatus representing another embodiment of this invention.

FIG. 4 is a schematic diagram showing another embodiment of the invention as applied to a parallel plate type plasma etching apparatus. In the apparatus of FIG. 4, the temperature controller 34 is divided into three parts 34A, 34B, 34C; the corresponding plasma generation regions in the vacuum container 38 are heated to respective desired temperatures; and the side surface and lower part of the specimen mount, the inner bottom portion of the processing chamber and the exhaust pipe are cooled to a desired temperature by the temperature controller 35. This prevents the reaction products from adhering to the inner sidewall of the processing chamber and instead causes them to adhere selectively to the lower part of the specimen mount, the inner bottom portion of the processing chamber and the exhaust pipe, as in the embodiment of FIG. 1. This in turn minimizes the chance of foreign matter falling onto the wafer or of foreign matter floating up from the bottom of the processing chamber.

Figure 5:
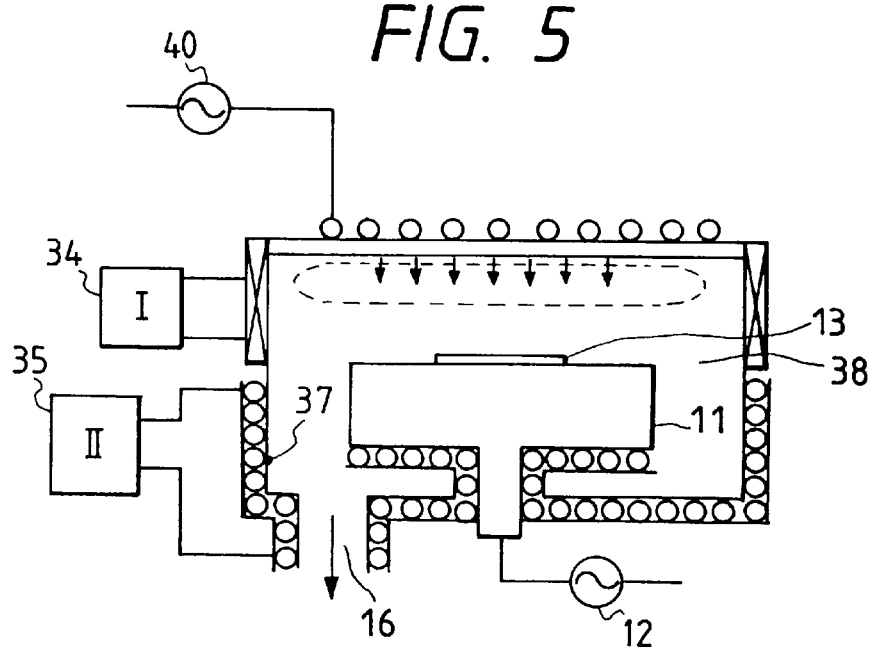
FIG. 5 is a vertical cross section showing an induction coupled discharge type apparatus representing still another embodiment of this invention.

FIG. 5 shows another embodiment of this invention as applied to an induction coupled discharge type apparatus, one of the external energy supply discharge types. In the apparatus of FIG. 5, the temperature controller 34 is provided on the plasma generation region in the vacuum container 38 to heat the inner sidewall of the processing chamber to a desired temperature, and the temperature controller 35 cools the side surface and lower part of the specimen mount, the inner bottom portion of the processing chamber and the exhaust pipe to a desired temperature.

This construction produces a similar effect to that of the embodiment of FIG. 1.

Figure 6:
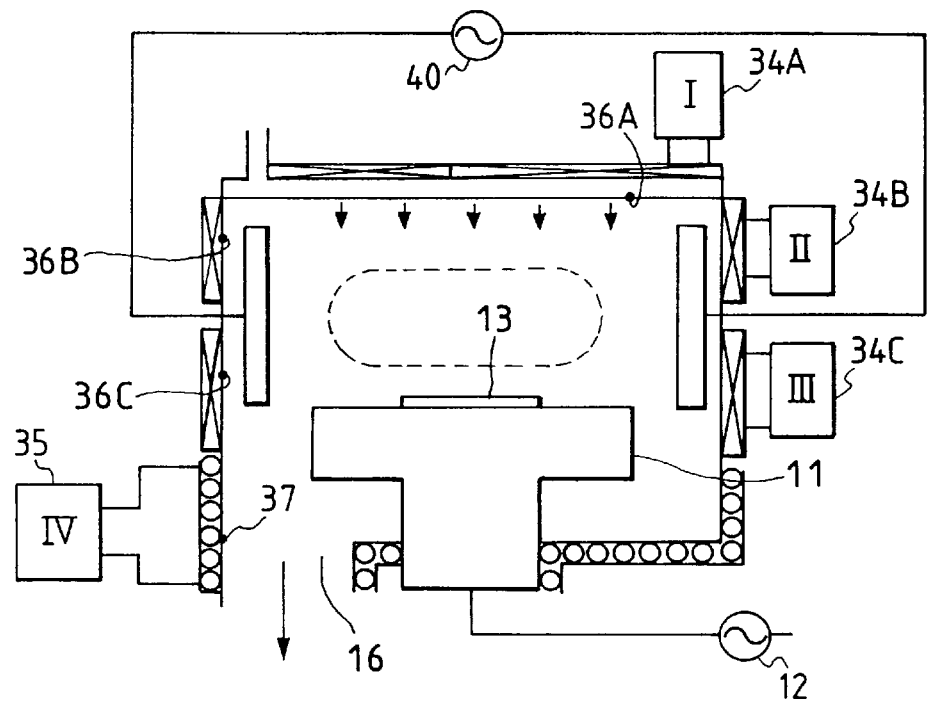
FIG. 6 is a vertical cross section showing a parallel plate type plasma etching apparatus representing a further embodiment of this invention.

FIG. 6 shows still another embodiment, of this invention as applied to a parallel plate type plasma etching apparatus. The construction of the apparatus of FIG. 6 is similar to the apparatus of FIG. 4 except for the electrodes used for internal energy supply discharge. That is, in the apparatus of FIG. 6, the temperature controller 34 is divided into three parts 34A, 34B, 34C to heat the plasma generation region in the vacuum container 38 to a desired temperature, while at the same time the side surface and lower part of the specimen mount, the inner bottom portion of the processing chamber and the exhaust pipe are cooled to a desired temperature by the temperature controller 35. This produces a similar effect to that of the embodiment of FIG. 1.

Figure 7:
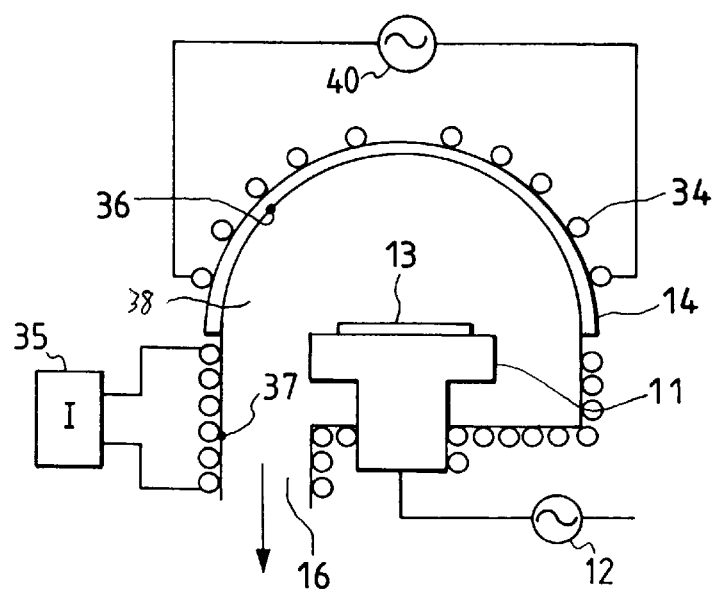
FIG. 7 is a vertical cross section showing a microwave discharge type apparatus representing a further embodiment of this invention.

FIG. 7 shows a further embodiment of this invention as applied to another type of apparatus, one of the external energy supply discharge types. In the apparatus of FIG. 7, coil 34 is wound around a dome type discharge tube 14, the coil 34 is coupled to RF (radio frequency) power source 40, a plasma is induced by the coil 34 to which RF voltage is applied, and the plasma is generated in a plasma generation region 38. The generated plasma heats the inner sidewall of the processing chamber to a desired temperature thereby eliminating the need to provide temperature controller 34, such as the other embodiment, while at the same time the side surface and lower part of the specimen mount, the inner bottom portion of the processing chamber and the exhaust pipe is cooled to a desired temperature by the temperature controller 35. This construction produces a similar effect to that of the embodiment of FIG. 1.

Although the above embodiments do not mention the charges on the foreign matter, the floating dust is very likely to be charged. One of the ways to cope with this problem may be to provide the side surface and lower part of the specimen mount, the inner bottom portion of the processing chamber and the exhaust pipe with a plate-like component that has a temperature control function and a function of controlling the potential to a negative and a positive potential.

With this invention, it is possible to provide a plasma processing apparatus and method, which prevents reaction products from adhering to portions in the processing chamber (inner sidewall of the processing chamber and upper electrode) located higher than where an object to be processed is mounted, and which causes the reaction products to adhere only to those portions that are controlled to a temperature where the reaction products solidify, thereby minimizing the generation of foreign matter and improving the yield.

What is claimed is:

1. In a plasma processing method which uses a plasma processing apparatus that includes a plasma generation chamber to which a processing gas is supplied to process a specimen and whose pressure is maintained at a predetermined pressure, a specimen mount on which to mount a specimen to be processed in the plasma generation chamber, and an evacuation means to evacuate the plasma generation chamber;

the plasma processing method comprising the steps of:
individually controlling the temperature of those portions in the plasma generation chamber where plasma is generated to a first temperature and the temperature of other portions of the apparatus to a second temperature which is less than the first temperature to minimize variations with time in the characteristics of plasma-processing a specimen.

2. A plasma processing method according to claim 1, wherein the step of individually controlling the temperature of those portions in the plasma generation chamber where plasma is generated to a first temperature includes controlling to a temperature range of greater than 100° C. to 400° C. at which reaction products sublimate and individually controlling the temperature of other portions of the apparatus to a second temperature includes controlling to a temperature of less than 100° C. to −200° C. at which reaction products solidify.

3. A plasma processing method according to claim 1, wherein the step of individually controlling to the first temperature includes applying heat to a sidewall of the plasma generation chamber to raise the temperature thereof and individually controlling to the second temperature includes applying cooling to other portions of the apparatus including portions of the plasma generation chamber below a surface of the specimen mount, an inner bottom portion of the plasma generation chamber and a gas exhaust pipe of the plasma generation chamber to lower the temperature thereof without applying heat thereto.

4. In a plasma processing method which uses a plasma processing apparatus that includes a plasma generation chamber to which a processing gas is supplied to process a specimen and whose pressure is maintained at a predetermined pressure, a specimen mount on which to mount a specimen to be processed in the plasma generation chamber, and an evacuation means to evacuate the plasma generation chamber;

the plasma processing method comprising the step of:
increasing the temperature of the sidewall of those portions in the plasma generation chamber where plasma is generated to at least a first temperature and cooling the inner wall of other portions of the apparatus to at least a second temperature which is less than the first temperature to minimize variations with time in the characteristics of plasma-processing a specimen.

5. A plasma processing method according to claim 4, wherein the step of increasing the temperature of the sidewall of those portions in the plasma generation chamber where plasma is generated to a first temperature includes heating to a temperature range of greater than 100° C. to 400° C. at which reaction products sublimate and cooling the inner wall of other portions of the apparatus to a second temperature includes cooling to a temperature of less than 100° C. to −200° C. at which reaction products solidify.

6. A plasma processing method according to claim 4, wherein the step of increasing to the first temperature includes applying heat to a sidewall of the plasma generation chamber and the step of cooling to the second temperature includes applying cooling to other portions of the apparatus including portions of the plasma generation chamber below a surface of the specimen mount, an inner bottom portion of the plasma generation chamber and a gas exhaust pipe of the plasma generation chamber without applying heat thereto.

7. A plasma processing apparatus comprising:
   a plasma generation chamber to which a processing gas is supplied to process a specimen and whose pressure is maintained at a predetermined pressure;
   a specimen mount on which to mount an object to be processed in the plasma generation chamber;
   an evacuation means to evacuate the plasma generation chamber; and
   a temperature control means for independently controlling the temperature of those portions in the plasma generation chamber where plasma is generated to at least a first temperature and the temperature of other portions of the apparatus to at least a second temperature which is less than the first temperature.

8. A plasma processing apparatus according to claim 7, wherein the temperature control means controls the temperature of those portions where plasma is generated and the temperature of other portions of the apparatus by linking them to one of the temperatures.

9. A plasma processing apparatus according to claim 7, wherein the temperature control means increases the temperature of the sidewall of the plasma generation chamber where plasma is generated and cools an inner wall of the chamber other than the sidewall.

10. A plasma processing apparatus according to claim 7, wherein the temperature control means includes means for removing matter from the sidewall portion other than the sidewalk of those portions where plasma is generated.

11. A plasma processing apparatus according to claim 7, wherein the temperature control means for independently controlling the temperature of those portions in the plasma generation chamber where plasma is generated to a first temperature controls to a temperature range of greater than 100° C. to 400° C. at which reaction products sublimate and for independently controlling the temperature of other portions of the apparatus to a second temperature controls to a temperature of less than 100° C. to −200° C. at which reaction products solidify.

12. A plasma processing apparatus according to claim 7, wherein the temperature control means for independently controlling to the first temperature includes means for applying heat to a sidewall of the plasma generation chamber and the temperature control means for independently controlling to the second temperature includes means for applying cooling to other portions of the apparatus including portions of the plasma generation chamber below a surface of the specimen mount, an inner bottom portion of the plasma generation chamber and a gas exhaust pipe of the plasma generation chamber without applying heat thereto.

13. A plasma processing apparatus comprising:
   a plasma generation chamber to which a processing gas is supplied to process a specimen and whose pressure is maintained at a predetermined pressure during processing;
   a specimen mount having a surface on which to mount an object to be processed in the plasma generation chamber;
   evacuation means to evacuate the plasma generation chamber, including a gas exhaust pipe;
   a first temperature controller which controls the inner sidewall portion of the plasma generation chamber above said surface of the specimen mount to a first temperature at which reaction products sublimate; and
   a second temperature controller which controls at least one of a part of the specimen mount below the surface on which to mount an object, an inner bottom portion of the plasma generation chamber below said surface of the specimen mount and said gas exhaust pipe to a second temperature at which reaction products solidify;
   wherein the second temperature is less than the first temperature.

14. A plasma processing method according to claim 13, wherein the first temperature controller controls a temperature range of greater than 100° C. to 400° C. at which reaction products sublimate, and the second temperature controller controls to a temperature of less than 100° C. to −200° C. at which reaction products solidify.

15. A plasma processing method according to claim 13, wherein the first temperature controller includes means for applying heat to the inner sidewall portion of the plasma generation chamber and the second temperature controller includes means for applying cooling to other portions of the apparatus including portions of the plasma generation chamber below a surface of the specimen mount, an inner bottom portion of the plasma generation chamber and a gas exhaust pipe of the plasma generation chamber without applying heat thereto.

* * * * *